United States Patent
Ongstad et al.

(10) Patent No.: US 7,469,001 B1
(45) Date of Patent: Dec. 23, 2008

(54) MID-IR OPTICALLY PUMPED SEMICONDUCTOR LASER

(75) Inventors: Andrew Ongstad, Albuquerque, NM (US); Ron Kaspi, Albuquerque, NM (US); Greg Dente, Albuquerque, NM (US); Michael Tilton, Albuquerque, NM (US); Joseph R. Chavez, Albuquerque, NM (US)

(73) Assignee: The United States of America as represented by the Secretary of the Air Force, Wahington, DC (US)

( * ) Notice: Subject to any disclaimer, the term of this patent is extended or adjusted under 35 U.S.C. 154(b) by 220 days.

(21) Appl. No.: 11/135,196

(22) Filed: May 23, 2005

(51) Int. Cl.
*H01S 3/04* (2006.01)
(52) U.S. Cl. .............. 372/70; 372/36; 372/75
(58) Field of Classification Search ............ 372/70, 372/75, 36
See application file for complete search history.

(56) References Cited

U.S. PATENT DOCUMENTS

| | | | |
|---|---|---|---|
| 5,625,635 A * | 4/1997 | Kurtz et al. | 372/45.011 |
| 6,327,293 B1 * | 12/2001 | Salokatve et al. | 372/96 |
| 6,448,642 B1 * | 9/2002 | Bewley et al. | 257/719 |
| 6,734,043 B2 * | 5/2004 | Meyer et al. | 438/122 |
| 6,735,234 B1 * | 5/2004 | Paschotta et al. | 372/75 |
| 6,813,296 B2 * | 11/2004 | Goyal et al. | 372/45.01 |
| 2002/0182779 A1 * | 12/2002 | Bewley et al. | 438/121 |
| 2003/0043877 A1 * | 3/2003 | Kaspi | 372/70 |

OTHER PUBLICATIONS

Choi et al , "High-power multiple-quantum well GaInAsSb diode lasers emitting at 2.1 mm with lower threshold current density"; 320 Applied Physics Letters 61Sep. 7, (1992) No. 10, NY US; XP000296376; pp. 1154-1156.*

* cited by examiner

*Primary Examiner*—Minsun Harvey
*Assistant Examiner*—Yuanda Zhang
(74) *Attorney, Agent, or Firm*—Kenneth E. Callahan

(57) ABSTRACT

A waveguide mode isolation layer added between the active region and the heat sink bonding material of an optically pumped semiconductor laser isolates the optical mode from the bonding material.

2 Claims, 5 Drawing Sheets

Device with mode-blocker layer

Device without mode-blocker layer

MID-IR OPTICALLY PUMPED SEMICONDUCTOR LASER

STATEMENT OF GOVERNMENT INTEREST

The conditions under which this invention was made are such as to entitle the Government of the United States under paragraph I(a) of Executive Order 10096, as represented by the Secretary of the Air Force, to the entire right, title and interest therein, including foreign rights.

DESCRIPTION OF THE PREFERRED EMBODIMENT

The vast majority of semiconductor lasers are diode lasers that rely on passing an electrical current through the layered semiconductor structure to create the electrons and holes that are needed for laser action. In order to accomplish this, diodes must include layers, which are doped either positive or negative. These doped cladding layers are low index materials that act as a waveguide to confine the laser's optical mode from spreading much beyond the active region and they are very good absorbers of the laser light. These characteristics keep the optical mode from touching the epitaxial bonding surface.

In contrast, the optically pumped semiconductor laser (OPSEL) is fundamentally different in that it does not require the presence of doped layers for operation. Furthermore, the substrate materials must be transparent to the pump laser wavelengths. This leads to a simplified layered structure in which the active layer has very weak index guiding. The broadened waveguide allows for the formation of a very wide optical mode whose transverse dimension extends far beyond the active and waveguide region. Since this wide mode can reach the physical limit of the semiconductor structure, it can touch the bonding metallization and incur significant optical loss and reduced power output. It is this problem, unique to the structure of an OPSEL, with a broadened waveguide design that is addressed herein.

Figure 1:
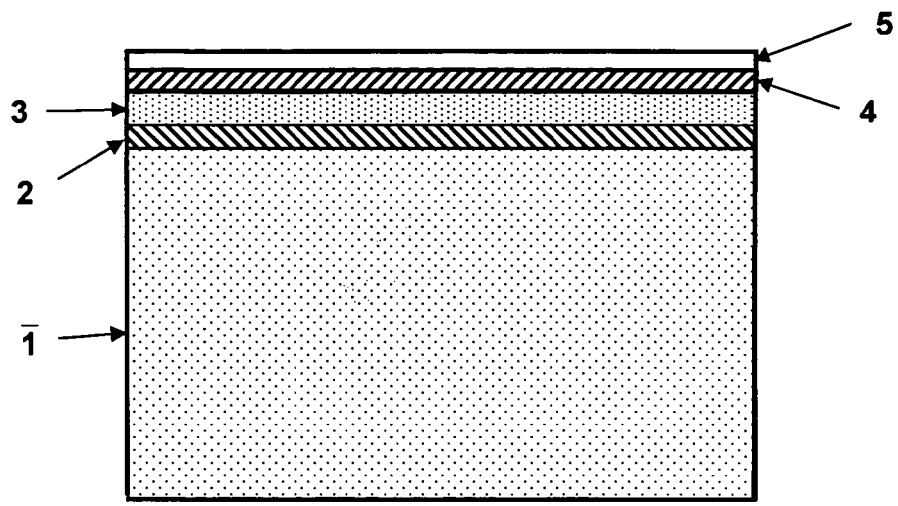
FIG. 1 is a cross-section of an optically pumped semiconductor laser showing the mode-blocking layer.

High powered, optically pumped semiconductor lasers operating in the mid-IR range (2-10 microns) generate a large amount of heat that must be dissipated. FIG. 1 shows a typical GaSb-based OPSEL structure in cross-section with an added waveguide mode isolation layer. The laser is optically pumped by another laser from the top (not shown). The structure is comprised of a substrate 1, an active region 2 where the mid-IR laser light is generated, an upper clad layer 3, a waveguide mode isolation layer 4, and a protective cap 5. The different layers of a typical OPSEL structure may be grown in a molecular beam epitaxial (MBE) chamber on a GaSb substrate 1. The laser active region 2 (light emitting region) may then be deposited on the substrate followed by a thicker layer of GaSb 3, a thin mode-blocking layer 4 (0.02-0.2 µm), and then a thin cap layer 5. The mode-blocker layer 4 may be comprised of any material that is lattice matched or nearly lattice matched to the upper clad layer 3 and has an approximate 0.5 lower index of refraction (0.3 to 0.7) than the upper clad layer. In the example given, the waveguide mode isolation layer may be comprised of a $Al(x)Ga(1-x)As(y)Sb(1-y)$ compound where x is approximately 0.90. The index of refraction of this layer may be between 3.2 and 3.3.

Figure 2:
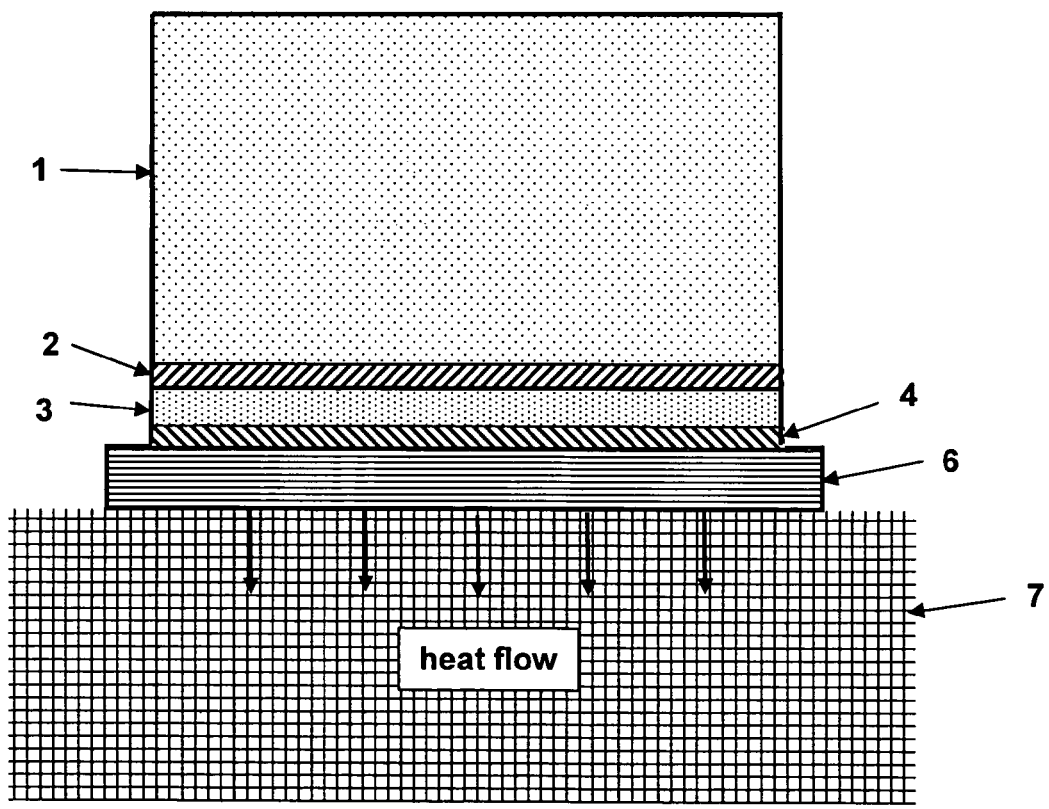
FIG. 2 shows the optically pumped semiconductor laser mounted on a heat sink with the epitaxial side down.

FIG. 2 shows this OPSEL structure bonded epitaxial side down to a heat sink 7. Here the bonding material layer 6 secures the device to the heat sink 7. Epitaxial side down bonding is the preferred orientation of bonding a mid-IR semiconductor laser and is routinely used to reduce thermal loading in the active region. The active region is much closer to the bonding metal/final heat sink in this arrangement so that the heat generated in the active region is easily conducted to the heat sink.

Figure 3:
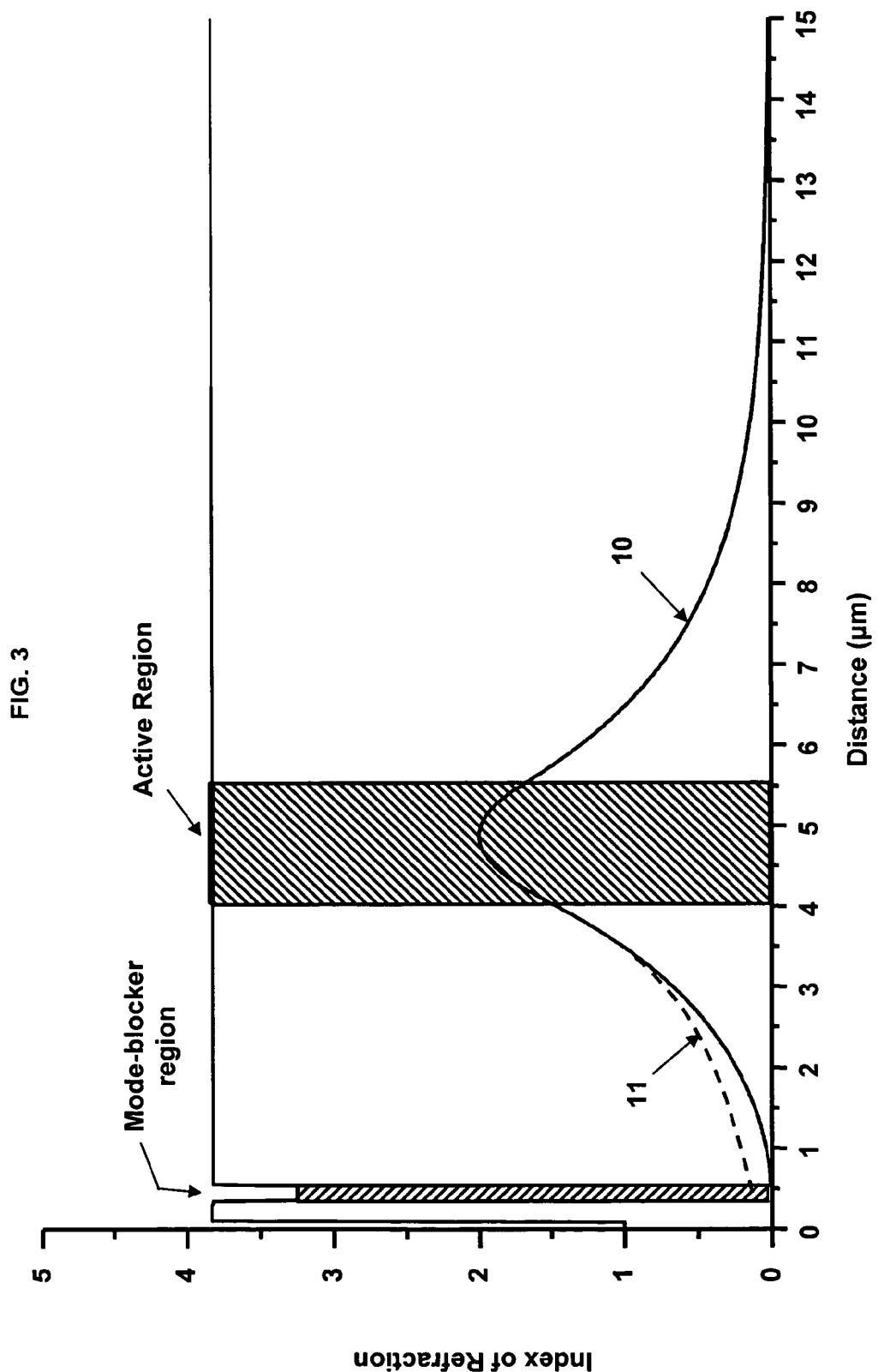
FIG. 3 is a plot of the index of refraction vs. distance from the top of the cap showing the mode profile with the mode-blocking layer (solid curve) and without (dashed curve).

Two methods have been used in the past to isolate the laser's optical mode from the bonding material or metal in optically pumped mid-IR lasers. The first uses a combination of bonding metals with the correct refractive properties such that if the laser's optical mode touches these metals, no increase in loss will occur. The drawback of this method is that the correct metallization must be determined and used or the waveguide loss will increase and the laser power will be decreased. The second method is to mount the laser epitaxial side up and pressure bond a diamond block/heat sink on the epitaxial side. The disadvantages of this method are that the optical pump beam is reflected at the diamond surface and the contact quality must be very good. Additional mounting hardware is also necessary to achieve the final heat-sinked semiconductor package. Epitaxial up mounting also cannot be used when the laser is run under thermally stressing conditions such as high duty cycle or quasi-CW operation FIG. 3 shows a plot of the index of refraction of the laser structure vs. the distance from the top of the protective cap. Superimposed on this chart is the optical mode profile 10 with the waveguide mode isolation layer present. It essentially blocks the optical mode from reaching the cap layer or the metal bonding/heat sink region for an epitaxial down side mounting. The dashed line 11 shows how the optical mode profile tail end would look if the mode-blocker layer were not present. The mode-blocking layer effectively blocks the main optical mode from the bonding interface region and preserves the laser outcoupling efficiency, i.e. the laser power when the device is mounted epi-down.

Figure 4:
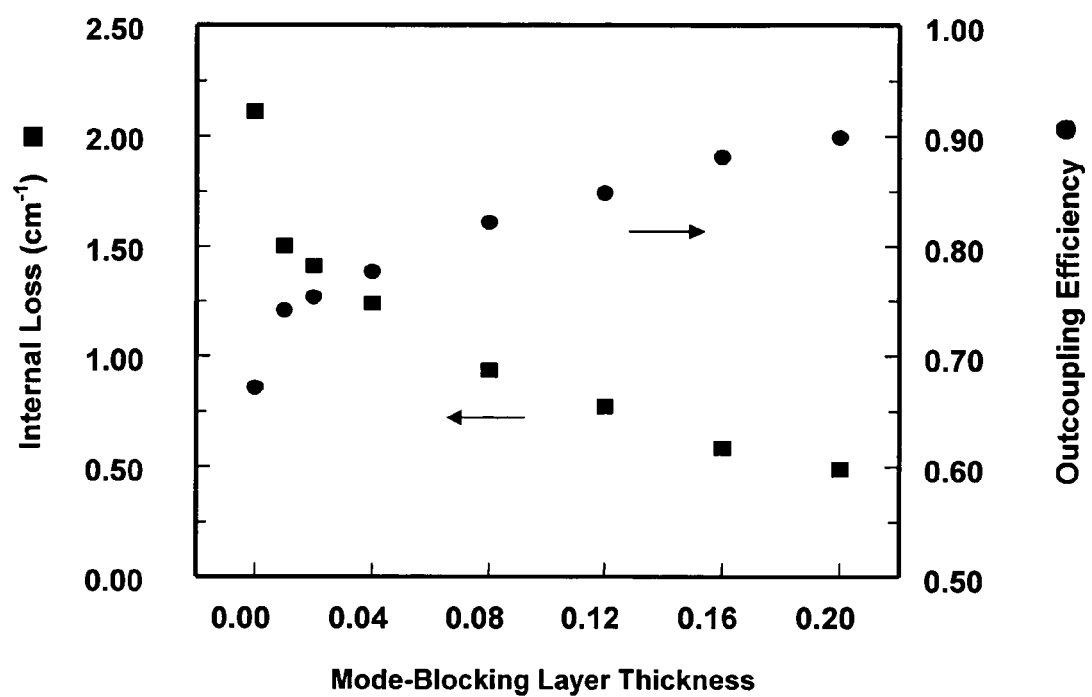
FIG. 4 is a plot of the calculated internal loss and outcoupling efficiency vs the mode-blocking layer thickness.

FIG. 4 shows calculated plots of the mode waveguide loss versus the waveguide mode isolation layer thickness for the representative dilute waveguide structure shown in FIG. 2. At zero thickness, the mode slightly penetrates the lossy metalized layer leading to 2.1 $cm^{-1}$ of loss, a. This is reduced to a=0.6 $cm^{-1}$ of loss when the waveguide mode isolation layer thickness, with an index of refraction of 3.25, is increased to 0.2 µm. FIG. 3 (right y-axis) also shows the outcoupling efficiency defined as, $$\frac{\frac{1}{l}\log\left(\frac{1}{r}\right)}{\frac{1}{l}\log\left(\frac{1}{r}\right)+a} \quad (1)$$

in which we assumed the front and back facet reflectivities, r, are 0.34 while the device length, l, is 2.5 mm. The plot shows that the outcoupling efficiency improves from 0.67 to 0.9 as the waveguide mode isolation layer thickness is increased to 0.2 μm.

Figure 5A:
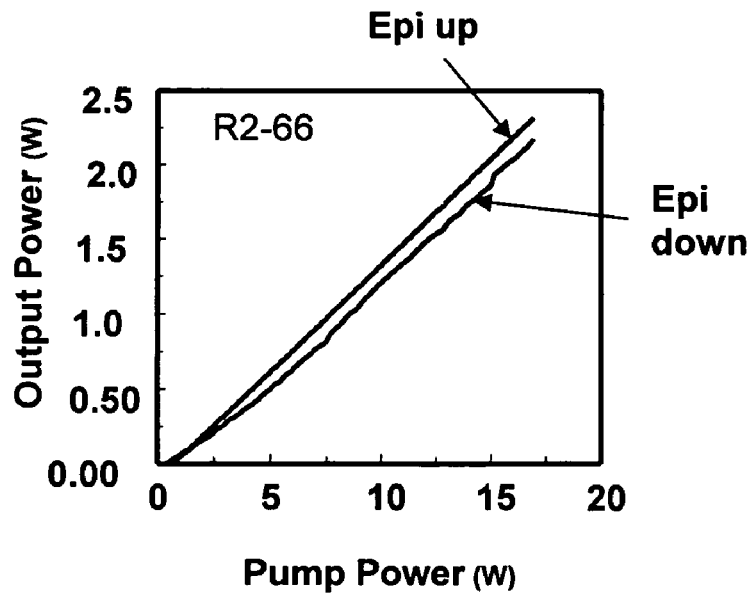
FIG. 5a is a plot of the output power vs. the pump power with the epitaxial layer mounted up and down for a laser containing the mode-blocking layer.
Figure 5B:
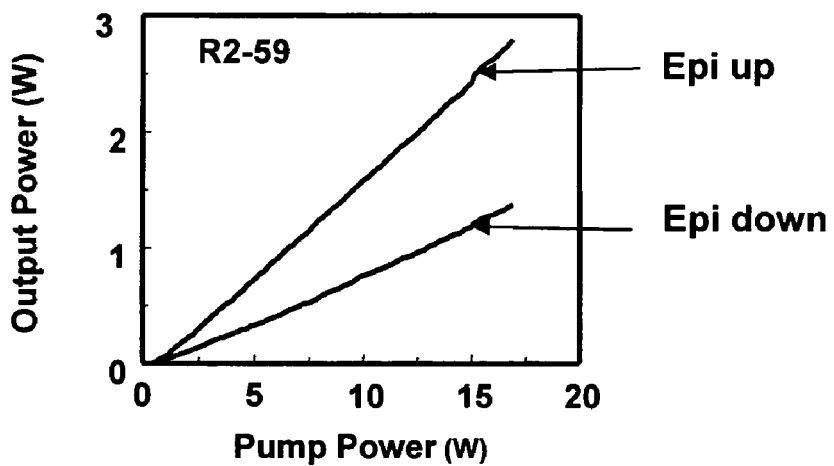
FIG. 5b is a plot of the output power vs. the pump power with the epitaxial layer mounted up and down for a laser without the mode-blocking layer.

To experimentally test the effectiveness of the waveguide mode isolation layer two similar devices were grown and compared. The structure of device A is shown in FIG. 1 and contained the waveguide mode isolation layer. Device B was identical in all respects except it did not have a waveguide mode isolation layer or cap layer. FIG. 5a and FIG. 5b shows the measured output powers for device A and device B, respectively, when tested epi side up and epi side down. When mounted epi up the mode cannot touch the substrate metallization, the losses are minimized and consequently the power measured in this configuration yields an upper power limit for the device. For device A only a small drop in power (~6%) is observed when the device is mounted epi down. In comparison, device B, which does not have the waveguide mode isolation layer, shows a much larger drop in power (~50%) when mounted epi-down.

Figure 6:
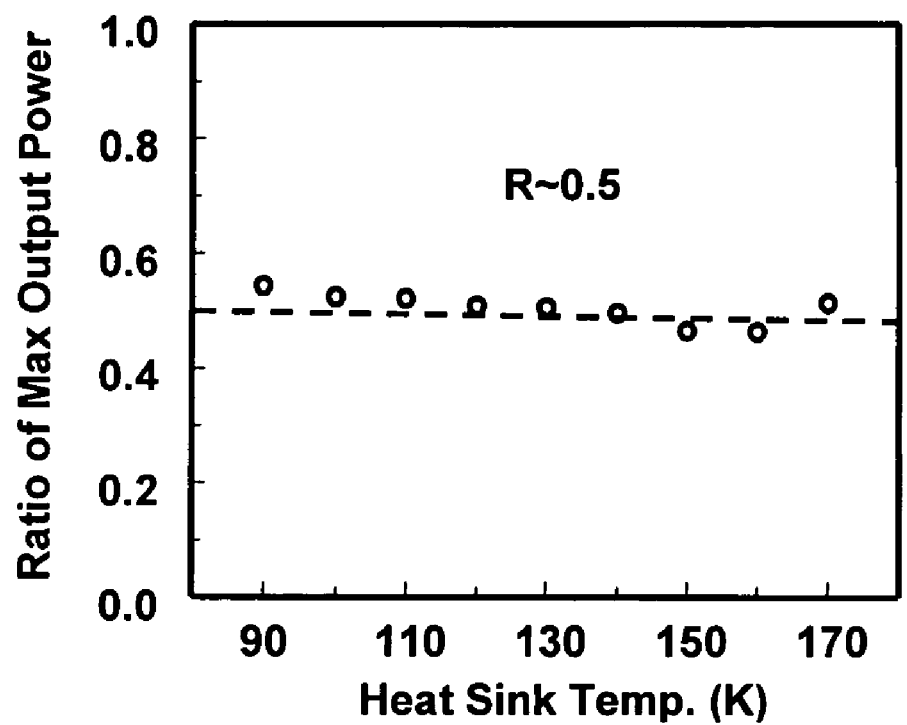
FIG. 6 is a plot showing the benefit of the mode-blocking layer operated over an extended temperature range.

The ratio of the maximum powers as a function of heat sink temperature, R(T), is defined as:

$$R(T) = \frac{P^B_{\max}(T)}{P^A_{\max}(T)}$$

where $P_{max}^A$ is the maximum output power for device A and $P_{max}^B$ is the maximum output power of device B. Both powers were measured on devices that were mounted epitaxial side down. The graph in FIG. 6 plots this ratio and indicates that, over the temperature range from 90° to 170° K, the device without the waveguide mode isolation layer is only outcoupling half the power of the device with the waveguide mode isolation layer. This indicates that the waveguide mode isolation layer is effective in protecting the device over a large operational temperature range.

The invention claimed is:

1. A high-powered, mid-infrared range optically pumped semiconductor laser having very weak index guiding and a simplified layered structure comprised of:
   a. an undoped substrate layer transparent to optical pump source wavelengths;
   b. an active region layer where said mid-infrared laser light is generated and having an index of refraction approximately equal to or slightly greater than the index of refraction of said substrate;
   c. an undoped upper clad layer having an index of refraction approximately equal to that of said substrate, whereby said active region sandwiched between said undoped substrate and said undoped upper clad layer has very weak index guiding;
   d. a 0.1 to 0.2 micron thick waveguide mode isolation layer comprised of any undoped material that is approximately lattice-matched to said undoped upper clad layer and has a 0.3 to 0.7 lower index of refraction than said undoped upper clad layer;
   e. a heat sink bonded to said waveguide mode isolation layer, whereby very weak index guiding of said active region permits a very wide transverse dimension optical mode while limiting the optical mode's transverse dimension from reaching the physical limits of the semiconductor structure, thereby enabling a high-powered, mid-infrared optically pumped semiconductor laser.

2. The optically pumped semiconductor laser of claim 1, wherein said undoped upper clad layer is comprised of the same material as said substrate.

* * * * *